(12) United States Patent
Chudzik et al.

(10) Patent No.: US 6,555,430 B1
(45) Date of Patent: Apr. 29, 2003

(54) PROCESS FLOW FOR CAPACITANCE ENHANCEMENT IN A DRAM TRENCH

(75) Inventors: Michael P. Chudzik, Beacon, NY (US); Johnathan Faltermeier, Lagrange, NY (US); Rajarao Jammy, Wappingers Falls, NY (US); Stephan Kudelka, Fishkill, NY (US); Irene McStay, Hopewell Junction, NY (US); Kenneth T. Settlemyer, Jr., Poughquag, NY (US); Helmut Horst Tews, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 09/723,420

(22) Filed: Nov. 28, 2000

(51) Int. Cl.⁷ ............... H01L 21/8242; H01L 21/8238; H01L 21/20; H01L 21/3205; H01L 21/44

(52) U.S. Cl. ............ 438/243; 438/212; 438/245; 438/386; 438/589; 438/665; 438/964

(58) Field of Search ............... 438/212, 243, 438/245, 248, 386, 387, 268, 255, 964, 254, 589, 398, 665

(56) References Cited

U.S. PATENT DOCUMENTS

| | | | | |
|---|---|---|---|---|
| 4,906,590 A | * | 3/1990 | Kanetaki et al. | 438/386 |
| 5,191,509 A | * | 3/1993 | Wen | 361/311 |
| 5,240,558 A | | 8/1993 | Kawasaki et al. | |
| 5,245,206 A | * | 9/1993 | Chu et al. | 257/309 |
| 5,350,707 A | | 9/1994 | Ko et al. | |
| 5,399,516 A | * | 3/1995 | Bergendahl et al. | 438/589 |
| 5,573,973 A | * | 11/1996 | Sethi et al. | 438/386 |
| 5,656,544 A | * | 8/1997 | Bergendahl et al. | 438/386 |
| 5,837,581 A | | 11/1998 | Cheng | |
| 5,872,033 A | | 2/1999 | Figura | |
| 5,877,061 A | * | 3/1999 | Halle et al. | 438/386 |
| 5,907,774 A | * | 5/1999 | Wise | 438/254 |
| 5,930,641 A | * | 7/1999 | Pan | 438/398 |
| 5,933,727 A | * | 8/1999 | Figura | 438/255 |
| 5,981,350 A | * | 11/1999 | Geusic et al. | 438/386 |
| 6,025,225 A | * | 2/2000 | Forbes et al. | 438/243 |
| 6,159,874 A | * | 12/2000 | Tews et al. | 438/964 |
| 6,177,696 B1 | * | 1/2001 | Bronner et al. | 257/301 |
| 6,204,141 B1 | * | 3/2001 | Lou | 438/386 |
| 6,359,300 B1 | * | 3/2002 | Economikos et al. | 257/301 |
| 6,448,131 B1 | * | 9/2002 | Cabral et al. | 438/243 |

FOREIGN PATENT DOCUMENTS

JP 357060843 A * 4/1982

* cited by examiner

*Primary Examiner*—Caridad Everhart
*Assistant Examiner*—Chuong A Luu
(74) *Attorney, Agent, or Firm*—Scully, Scott, Murphy & Presser; Steven Capella, Esq.

(57) ABSTRACT

Methods forming a trench region of a trench capacitor structure having increase surface area are provided. One method includes the steps of forming a discontinuous polysilicon layer on exposed walls of a lower trench region, the discontinuous polysilicon layer having gaps therein which expose portions of said substrate; oxidizing the lower trench region such that the exposed portions of said substrate provided by the gaps in the discontinuous polysilicon layer are oxidized into oxide material which forms a smooth and wavy layer with the discontinuous polysilicon layer; and etching said oxide material so as to form smooth hemispherical grooves on the walls of the trench region.

16 Claims, 4 Drawing Sheets

PROCESS FLOW FOR CAPACITANCE ENHANCEMENT IN A DRAM TRENCH

DESCRIPTION

Field of the Invention

The present invention relates to integrated circuits (ICs), and more particularly to ICs which include at least a deep trench memory cell in which the trench walls have been roughened for enhanced capacitance using polysilicon as a roughening agent.

BACKGROUND OF THE INVENTION

A memory cell in an IC comprises a transistor and an associated capacitor. The capacitor, which is typically formed in a portion of a trench, consists of a pair of conductive plates, i.e., electrodes, which are separated from each other by a node dielectric material. Information or data is stored in the memory cell in the form of charge accumulated on the capacitor. As the density of the ICs with memory cells is increased, the area for the capacitor becomes smaller and the amount of charge the capacitor is able to accumulate is reduced. Thus, with less charge to detect, reading the information or data from the memory cell becomes much more difficult.

With a limited fixed space or volume for the capacitor of a memory cell in a highly integrated circuit, there are three known techniques for increasing the amount of charge within a fixed space or area. These three known techniques include: (1) decreasing the thickness of the dielectric material, i.e., node dielectric, that is located between the capacitor plates; (2) changing the dielectric material to one with a dielectric constant higher than $SiO_2$ or $Si_3N_4$; or (3) increasing the surface area of the space to be used for the capacitor.

Of the above mentioned techniques, solution (3) is the most viable because the other two solutions have drawbacks associated therewith. For example, solution (1), which thins the capacitor dielectric, also increases leakage currents that may affect the memory retention performance of the capacitor and the reliability of the memory cell. Solution (2), which purports to change the dielectric material to a higher-dielectric material, will only cause a slight improvement in charge storage because the dielectric constant of suitable alternative dielectrics is only slightly higher than the dielectric material currently being used. Moreover, the substitution of alternative dielectrics may be more complicated, more expensive and provide fabrication problems that are heretofore unknown. Accordingly, solution (3), i.e., increasing the surface area of the space to be used for the capacitor, provides the most promise for substantially improving the amount of charge stored without causing any of the problems mentioned for solutions (1) and (2) above.

One previous solution to increase the surface area of the capacitor is to replace common stack capacitor technology with trench capacitors. In common stack capacitor technology, the capacitor is built on a surface created on a semiconductor substrate. Whereas in trench capacitor technology, the capacitor is formed within a trench that is formed in a semiconductor substrate itself. An increase in depth of the trench, increases the surface area of the capacitor. However, the depth of the trench is limited by present fabrication methods and tools. This problem is further compounded by the forever increasing density of ICs achieved by dimensional shrinkage. To offset the loss of surface area due to a reduction in width, the depth of the trench must be further increased to the point where the necessary depth is not achievable or becomes prohibitively expensive.

Another prior art method to increase the surface area of the capacitor is to provide capacitor plates that contain textured or roughened surfaces in the deep trench adjacent to the dielectric material. A capacitor plate having roughened surface area increases the amount of surface area of the capacitor due to the peaks and valleys of the roughened surface. With this prior art structure and method, the depth of the trench is maximized and the rough surface of the plates is designed to give maximum surface area based on a cross-section of the roughened surface so that the surface area is three-dimensional at the interface of the plates and the dielectric material. However, this prior art method may result in microscopic roughness with sharp features or peaks on the order of a few Angstroms on the capacitor plate which may give rise to leakage through the dielectric material.

Co-assigned U.S. application Ser. No. 09/559,884, filed Apr. 26, 2000 provides a method of roughening the walls of a deep trench capacitor for increasing the charge storage capability of the trench without current leakage. In that application, oxidizable hemispherical silicon grains (HSG) are employed. When such material is employed in roughening the interior walls of the trench, residual polysilicon may remain on the trench walls therefore allowing current leakage to occur.

In view of the above mentioned drawbacks, there is a need to develop a new and improved method of increasing the surface area of the capacitor in a deep trench memory cell without causing any substantial current leakage.

SUMMARY OF THE INVENTION

One object of the present invention is to provide a method of fabricating a deep trench memory cell such as a deep trench dynamic random access memory (DT DRAM) cell in which the surface area of the capacitor has been increased.

A further object of the present invention is to provide a method of fabricating a deep trench memory cell in which the capacitor surface area is increased without causing any substantial current leakage through the cell.

These and other objects and advantages are obtained in the present invention by utilizing a method wherein the increased capacitor surface area of the deep trench memory device is obtained by roughening the interior walls (sidewalls and bottom wall portion) of the trench using polysilicon as a roughening agent. It is noted that the term "deep trench" is used herein to denote a trench that has a depth of from about 2 to about 12 $\mu$m, more particularly, 6–8 $\mu$m. It is also noted that the inventive method provides an alternative method to the one disclosed in co-assigned U.S. Application Ser. No. 09/559,884, filed Apr. 24, 2000.

Specifically, the method of the present invention comprises the steps of:

(a) forming a deep trench in a semiconductor substrate, said deep trench having an upper region, a lower region and interior walls;

(b) forming a collar stack in said upper region of said deep trench;

(c) forming a discontinuous polysilicon layer on exposed interior walls of the lower trench region, said discontinuous polysilicon layer having gaps therein which expose portions of said substrate;

(d) oxidizing the lower trench region such that the exposed portions of said substrate provided by the gaps in the discontinuous polysilicon layer are oxidized into oxide material which forms a smooth and wavy layer with said discontinuous polysilicon layer; and (e) etching said oxide material so as to form smooth hemispherical grooves on the walls of the trench region.

The above mentioned processing steps, which can be used with conventional deep trench processing steps, provide an estimated area enhancement of about 1.5 to about 2 times that of a bare Si surface. Contrary to the case of HSG, no residual polysilicon remains on the interior walls of the trench after etching; therefore, no current leakage due to polysilicon grain boundaries is observed when the present invention is employed.

In one embodiment of the present invention, the lower region of the deep trench is subjected to an isotropic etching process prior to depositing the discontinuous polysilicon layer on the trench walls. When this embodiment is employed, the lower trench region is broadened to extend beyond that of the upper trench region.

In addition to the above-mentioned method, the present invention also provides an alternative method which can be used to increase the surface area of a capacitor in a deep trench memory cell. Specifically, the alternative method comprises the steps of:

(a) forming a deep trench in a semiconductor substrate, said deep trench having an upper region, a lower region and interior walls;

(b) forming a $SiO_2$ layer on exposed interior walls of said deep trench in said lower region;

(c) forming a discontinuous polysilicon layer on said $SiO_2$ layer provided in step (b), said discontinuous polysilicon layer having gaps therein which expose portions of said $SiO_2$ layer;

(d) etching any exposed $SiO_2$ layer not covered by said discontinuous polysilicon layer so as to expose portions of said semiconductor substrate;

(e) laterally etching said exposed portions of said semiconductor substrate so as to form a recessed pocket in said deep trench, while simultaneously etching said discontinuous polysilicon layer so as to expose remaining portions of said $SiO_2$ layer; and (f) etching said remaining portions of said $SiO_2$ layer.

As in the previous method, a collar oxide may be formed in the upper region of the deep trench prior to conducting step (b) of the alternative method.

DETAILED DESCRIPTION OF THE INVENTION

Figure 1:
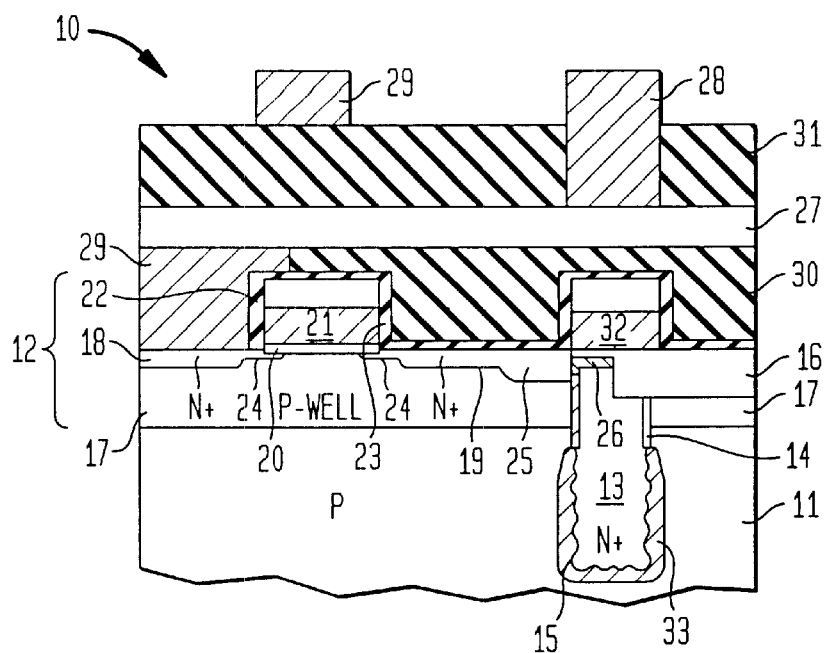
FIG. 1 is a cross-sectional view of a memory cell of an integrated circuit showing a field effect transistor (FET) and a deep trench capacitor of the present invention.

The present invention which provides a deep trench capacitor structure having roughened trench walls and a methods of fabricating the same will now be described in more detail by referring to the drawings that accompany the present application. It is noted that in the accompanying drawings, like and corresponding elements are referred to by like reference numerals.

Reference is first made to FIG. 1 which shows the basic parts of a memory cell 10, namely a transistor and capacitor, which is fabricated in and on a semiconductor substrate 11 such as Si, and which herein is a small portion of a DRAM. Reference numeral 17 denotes the P well region of the memory cell. The memory cell comprises field effect transistor (FET) 12 and trench capacitor 13 which is connected to and in combination with FET 12. This memory cell is a component of a memory array of similar memory cells (not shown). Capacitor 13 functions as charge storage element and as a means for storing data in memory cell 10.

Disposed in the trench is N+ polysilicon which serves as one of the electrodes of the capacitor. An oxide collar 14 is disposed at the upper segment of the deep trench capacitor around periphery 15 of the trench and abuts a shallow trench isolation (STI) region 16 on a side of the trench that is opposite FET 12. The FET includes N+ source region 18 and N+ drain region 19 in substrate 11 on opposite sides of a gate oxide 20 which is formed in and on the substrate underlying gate electrode 21. The gate electrode includes a region of doped polysilicon and a refractory metal. Insulating sidewall spacers 22 and 23 are present on the gate electrode and are formed after implantation of the N-impurities adjacent the gate electrode, which implantation creates lightly doped drain (LDD) regions 24. Sidewall spacers 22 and 23 provide a mask for implanting the N-type impurities of the source and drain regions 18 and 19, respectively. At the same time as the gate electrode is being formed, a conductive layer of doped polysilicon and a refractory metal is deposited over the insulated trench by the STI to provide a passover wordline 32.

The structure shown in FIG. 1 also includes a buried strap region 25 which serves to physically and electrically connect the trench capacitor to the FET. As shown, the buried strap region is disposed in a portion of drain region 19. A conductive interposer 26 is positioned at the top of the trench above collar oxide 14 and abuts the buried strap region. To interface with other memory cells in the memory array, bitline 27 extends above the gate electrode. Contact 28 is connected to the gate electrode through a path not shown. Contact 29 is connected to the source region through a path also not shown. Insulating layers 30 and 31 separate the contacts from the bitline and wordline contacts. The wordline, shown as the passover wordline 32, is part of the memory array and, through the interaction of the bitline and wordline, the capacitor of the present invention is charged and discharged in the writing and reading of data into and out of the memory cell.

Another FET, not shown, and trench(es) (not shown) may be included in the memory cell adjacent to the FET. Additional trenches may also be included adjacent to the trench shown in FIG. 1. In the embodiment shown in FIG. 1, the trench capacitor includes a buried out-diffused electrode 33 whose shape is conformal to that of the deep trench. Herein, electrode 33 may be glass doped with arsenic which diffuses into the substrate around the lower segment of the trench as shown in FIG. 1 when subjected to an annealing process. Alternatively, a dopant gas containing arsine or phosphine may be employed in forming electrode 33. It should be noted that region 33 may also be formed on the interior of the trench. When such an embodiment is employed, region 33 is composed of a conductive metal or metal oxide.

It should be understood that the above discussion provides a description of one type of memory cell in which the method of the present invention can be employed in forming the capacitor region thereof. Other types of memory cells which include similar components to those described hereinabove are also contemplated in the present invention; therefore, the present invention is by no ways limited to the structure shown and illustrated in FIG. 1. For example, the P-type substrate and the N-well may be replaced by an N-type substrate and an N-well or P-well.

The various processes used in forming elements of the memory cell other than the capacitor are not described herein since such processes are well known to those skilled in the art. Instead, the discussion that follows focuses on the inventive method used in providing roughened-trench walls. The term "trench walls" is used herein to denote both the vertical interior sidewalls of the deep trench and the bottom interior wall.

Figure 2:
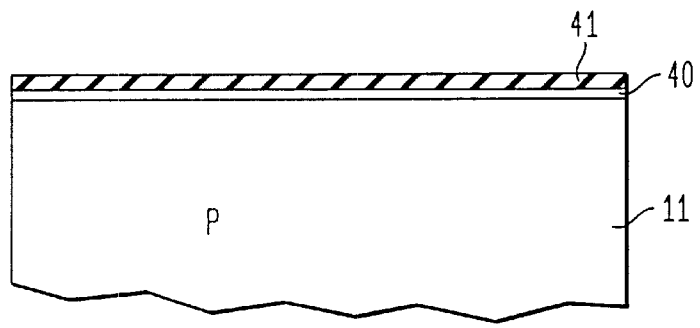
FIGS. 2–9 are pictorial representations of the inventive deep trench structure through various processing steps of the present invention.

Reference will now be made to FIGS. 2–9 which illustrate the basic processing steps employed in the present invention for providing a trench for a capacitor element that contains roughened interior walls. Specifically, FIG. 2 illustrates an initial structure of the present invention used in forming the trench capacitor of the memory structure of FIG. 1. The initial structure includes P-substrate 11 having pad oxide layer 40 formed on a surface of the substrate, and an insulating layer 41 formed on a top surface of pad oxide layer 40. Pad oxide layer 40 is thermally grown or deposition on a surface of the substrate.

Next, an insulating layer 41, e.g., silicon nitride, which has a different etch selectivity than pad oxide layer 40 is deposited using conventional deposition means on the pad oxide layer. The thickness of the pad oxide and the insulating layers employed in FIG. 2 are not critical to the present invention, but typically the thickness of the pad oxide layer is from about 1 to about 10 nm and the thickness of the insulating layer is from about 20 to about 500 nm. More preferably, the pad oxide has a thickness of from about 4 to about 8 nm and the insulating layer has a thickness of from about 100 to about 300 nm.

Figure 3:
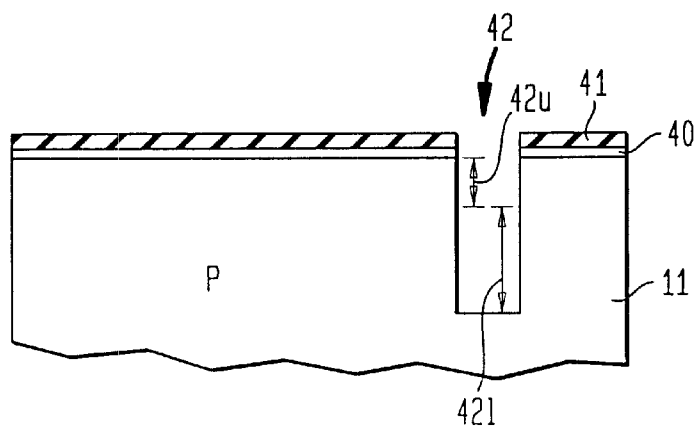

Conventional lithography and etching such as reactive-ion etching (RIE) are employed so as to form a trench opening 42 in the structure which extends to a depth that is beyond the metallurgical boundary of a P-well region, See FIG. 3. It should be noted that the P-well region is formed in subsequent processing steps that follow the inventive method. The trench opening can be divided into two regions; an upper trench region 42u and a lower trench region 42l.

Figure 4:
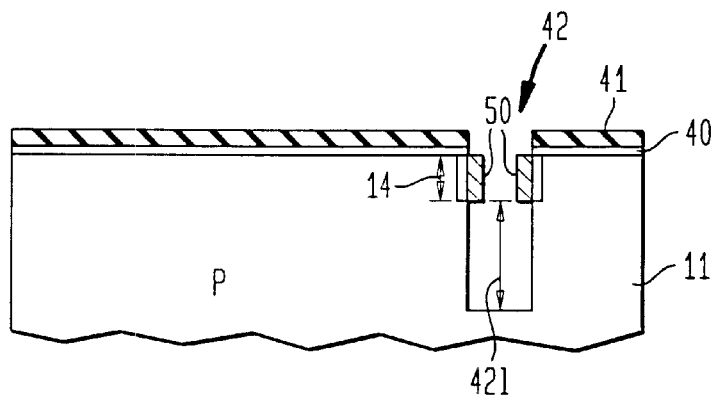

At this point of the present invention, collar oxide region 14 is formed in the upper region of the trench opening using any conventional processing technique well known to those skilled in the art so as to provide the structure shown in FIG. 4. The collar oxide region may comprise a deposited oxide such as TEOS (tetraethylorthosilicate) or be grown thermally. In a preferred embodiment of the present invention, the collar oxide also includes a nitride layer 50 that is formed on top of the oxide collar by utilizing a conventional deposition technique.

Figure 5:
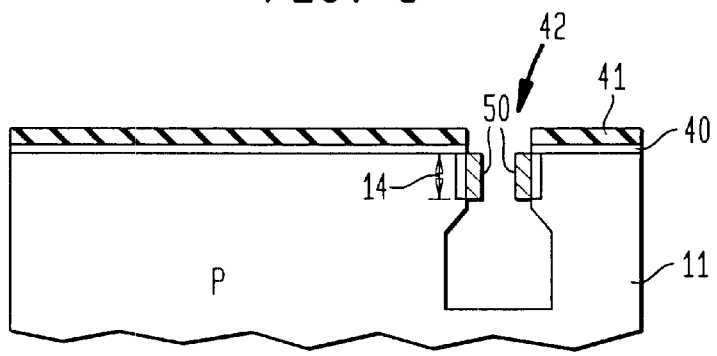
Figure 6:
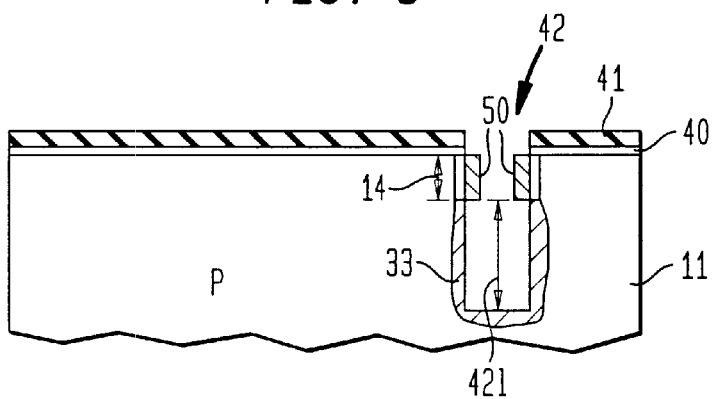

Following the formation of the oxide collar, the lower region of the trench, which is defined herein to be the portion of the trench that is beneath the oxide collar region may be optionally subjected to a conventional isotropic etching process that is capable of forming a trench that contains a broadened lower trench region. This embodiment of the present invention is shown in FIG. 5 and will not be reproduced in the remaining drawings. Although the broadened lower trench structure is not depicted in the remaining drawings, the following processing steps are applicable for the structure of FIG. 5 as well.

Next, region 33, which represents one electrode of the capacitor shown in FIG. 1, may now be formed in the lower region of the trench by first depositing a doped material layer such as arsenic doped glass or doped polysilicon in the lower portion of the trench including sidewalls and bottom wall portion; out-diffusing the dopant from the doped material layer using conventional annealing conditions well known to those skilled in the art; and removing any remaining doped material layer from the lower portion of the trench. These steps provide the structure shown in FIG. 6. For clarity, region 33 will not be shown in the remaining drawings. Alternatively, it is possible to skip this step of the present invention until after the roughened trench walls are provided.

Figure 7:
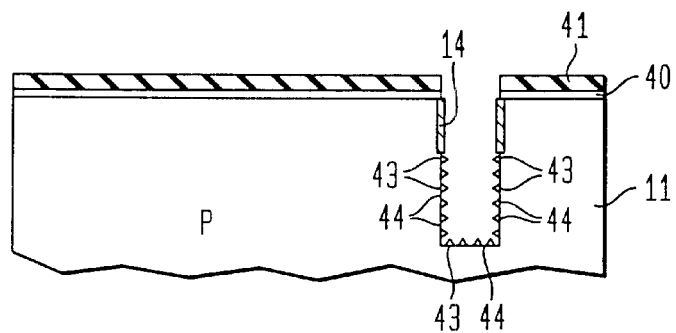

FIG. 7 shows the formation of a discontinuous polysilicon layer 43 on the exposed sidewalls and bottom wall of the trench. For clarity, in this figure as well as the remaining figures, the oxide and nitride layers of the collar region are shown as a single layer and are represented simply by reference numeral 14. In accordance with the present invention, the discontinuous polysilicon layer has gaps 44 therein which expose portions of substrate 11. The discontinuous polysilicon layer, which has a thickness of less than 250 Å, preferably about 10 to about 150 Å, is formed utilizing a conventional deposition process such as chemical vapor deposition (CVD) which is capable of forming a polysilicon layer which includes amorphous silicon islands and/or polycrystalline grains which are separated from each other by gaps 44. Thus, during this step of the present invention, the polysilicon layer is formed as discrete layers or islands on the walls of the trench which are separated from each other by the Si substrate which is present in the gaps.

Figure 8:
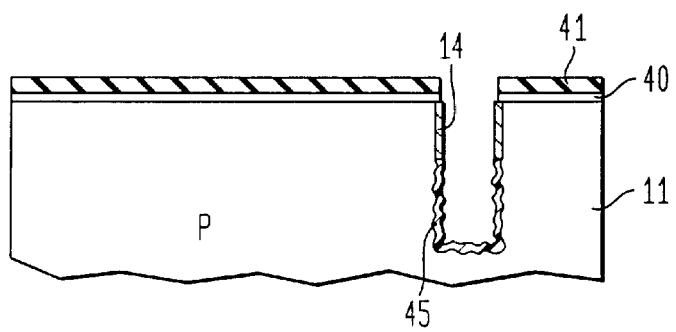

The trench structure which includes the discontinuous polysilicon layer (or islands of polysilicon) is then subjected to an oxidation step which is capable of oxidizing the gap regions into oxide material which forms a smooth and wavy layer with said discontinuous polysilicon layer. This structure is shown in FIG. 8 wherein reference numeral 45 denotes the smooth and wavy layer. It is emphasized that the smooth and wavy layer is a continuous layer which comprises the discrete polysilicon islands and oxide material that is present between the polysilicon islands.

Typically, in the present invention, this oxidation step is carried out in an oxidizing atmosphere, such as air, $O_2$, NO, and $N_2O$, at a temperature of about 200° C. or more, with a temperature of from about 600° C. to about 900° C. being more preferred. A rapid thermal oxidation process or other conventional oxidization process may be employed. The oxidation process may be carried out at a single temperature or various ramp and soak cycles may be employed. The oxidation step may be carried out such that the polysilicon grains are completely consumed.

Figure 9:
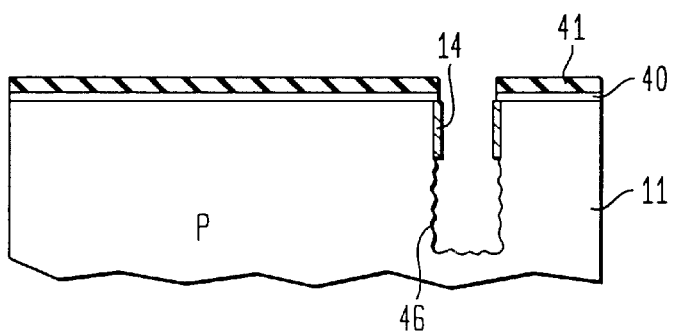
Figure 10:
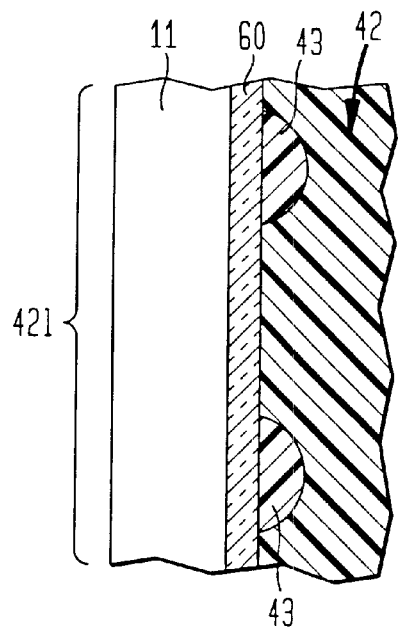
FIGS. 10–13 are pictorial representations of portions of one-side of a deep trench structure during the course of the alternative method of the present invention.

Next, and as illustrated in FIG. 9, an oxide etching step is performed to remove the oxide material from the lower portion of the trench so as to form smooth hemispherical grooves 46 on the-walls of the lower trench region. In one embodiment of the present invention, the oxide etching step comprises the use of a wet chemical etchant such as HF. This step of the present invention results in the formation of smooth hemispherical grooves on the trench walls which have an estimated area enhancement of from about 1.5 to about 2 times that which can be provided by a bare Si surface. Moreover, contrary to the process described in co-assigned U.S. application Ser. No. 09/559,884, filed Apr. 24, 2000, no residual polysilicon remains on the trench walls. Therefore, no increase in current leakage due to polysilicon grain boundaries is observed in the present invention.

If not previously done, region 33 which represents a buried plate region of the capacitor may be formed in substrate and thereafter the node dielectric layer and the other plate of the capacitor are formed in the trench region. It should be noted that the node dielectric layer is formed on the now roughened walls of the trench structure shown in FIG. 9. The node dielectric and the other capacitor plate are formed utilizing conventional processes well known to those skilled in the art and other conventional processes capable of forming the structure shown in FIG. 1 are next performed.

Reference is now made to FIGS. 10–13 which show an alternative method of the present invention which can be used in increasing the surface area of the capacitor. Specifically, the alternative method includes forming deep trench 42 in semiconductor substrate 11 utilizing the above-mentioned deep trench formation processes. As previously described, deep trench 42 includes an upper region (not shown in FIGS. 10–13) and lower region 421.

$SiO_2$ layer 60 is then formed on exposed sidewalls of said deep trench in said lower region and thereafter discontinuous polysilicon layer 43 is formed on $SiO_2$ layer 60. As previously described, discontinuous polysilicon layer 43 has gaps therein which expose portions of $SiO_2$ layer 60; See FIG. 10. $SiO_2$ layer 60 may be replaced with other silicon-containing materials such as silicon nitride. Silicon-containing layer 60 helps in obtaining uniform polysilicon islands on the trench sidewalls The $SiO_2$ used in the alternative method is formed utilizing any conventional thermal growing process such as oxidation. In accordance with the present invention, $SiO_2$ layer 60 is an ultra-thin oxide whose thickness is from about less than 1 nm to about 20 nm.

Discontinuous polysilicon layer 43 is formed utilizing the basic processing steps mentioned hereinabove. More preferably, discontinuous polysilicon layer 43 is formed using a furnace deposition technique utilizing temperatures in excess of 550° C.

Figure 11:
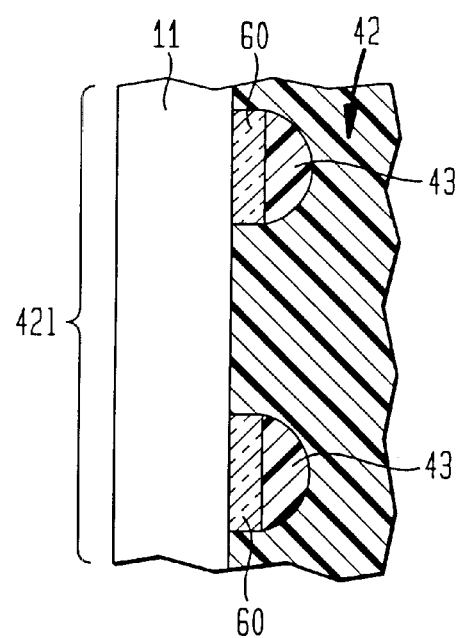
Figure 12:
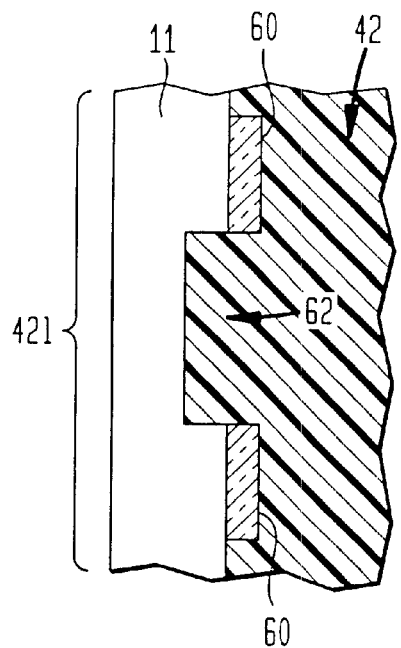

Next, and as shown in FIG. 11, any exposed $SiO_2$ layer 60 not covered by the discontinuous polysilicon layer is etched so as to expose portions of semiconductor substrate 11. Any conventional etching process that is highly selective for etching oxide as compared to Si can be employed in the present invention. Following this $SiO_2$ etching process, a conventional lateral etching process is performed so as to remove exposed portions of the semiconductor substrate forming recessed pocket region 62 in the deep trench; See FIG. 12. It should be noted that during this etching step, discontinuous polysilicon layer 43 is simultaneously etched exposing remaining portions of the $SiO_2$ layer. A stated above, any conventional lateral etching process which has a high selectivity for removing Si as compared to oxide can be employed in the present invention. Typically, base chemistries such as those of $NH_4OH$ can be used for etching Si. Alternatively, dry etching such as chemical downstream etching (CDE) can also be employed.

Figure 13:
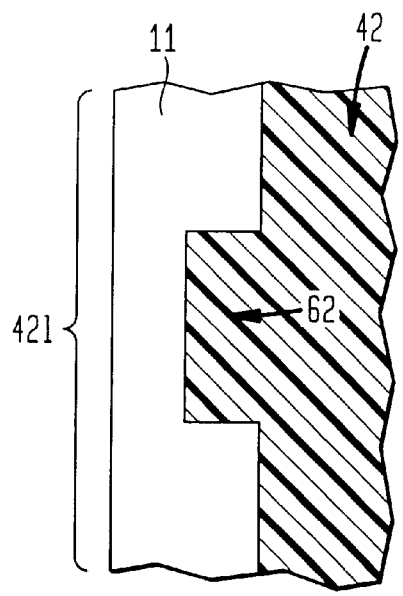

FIG. 13 shows the last step of the alternative method of the present invention wherein the remaining portions of the $SiO_2$ layer are etched from the trench sidewalls utilizing a conventional etching process which has a high selectivity for removing oxide as compared to Si. Typical wet etching techniques of silicon through the $SiO_2$ layer will result in a V-groove cross-section due to the highly crystallographic selectivity of $NH_4OH$ etch chemistries. The resulting sharp corners of the V-groove act as points of high electric field stress concentration and results in lower reliability and increasing leakage currents. The sharp corners can be removed using two techniques as a following step to the $HF/NH_4OH/HF$ etching sequence of the trench wall:

Hydrogen gas anneal at elevated temperatures (greater than about 600° C.) and reduced pressures (less than about 600 Torr) will cause localized silicon removal from the high portions causing a smoothening effect.

An additional chemical or thermal oxidation method will form a layer of $SiO_2$ in the V-groove silicon, which can then be etched away leaving a less acute angle in the V-groove.

Note, pocket region 62 provides for increased surface area for forming the capacitor within the deep trench. It is noted that the various embodiments mentioned-above in connection with the first method are also applicable here for the alternative method. That is, the alternative method may include formation of a collar oxide in the upper region of the deep trench as well as the other embodiments mentioned hereinabove.

It is also noted that the various methods of the present invention can also be used in other applications which require a trench region having roughened interior sidewalls.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method of forming a deep trench structure having increased surface area comprising the steps of:
   (a) forming a deep trench in a semiconductor substrate, said deep trench having an upper region, a lower region and interior walls;
   (b) forming a collar stack in said upper region of said deep trench;
   (c) forming a discontinuous polysilicon layer on exposed interior walls of the lower trench region, said discontinuous polysilicon layer having gaps therein which expose portions of said substrate;
   (d) oxidizing the lower trench region such that the exposed portions of said substrate provided by the gaps in the discontinuous polysilicon layer are oxidized into oxide material which forms a smooth and wavy layer with said discontinuous polysilicon layer; and
   (e) etching said oxide material and any remaining discontinuous polysilicon layer so as to form smooth hemispherical grooves on the walls of the trench region which are substantially free of polysilicon.

2. The method of claim 1 wherein said deep trench is formed utilizing lithography and etching.

3. The method of claim 1 wherein said collar oxide region includes a nitride layer formed on an oxide layer.

4. The method of claim 3 wherein said oxide layer is formed by a thermal growing process or by depositing tetraethylorthosilicate.

5. The method of claim 1 wherein after conducting step (b), but prior to conducting step (c), the lower trench region is subjected to an isotropical etching process which broadens the lower trench region.

6. The method of claim 1 wherein said discontinuous polysilicon layer has a deposited thickness of less than 250 Å.

7. The method of claim 6 wherein said discontinuous polysilicon layer has a thickness of from about 10 to about 150 Å.

8. The method of claim 1 wherein said oxidizing step is carried out in an oxidizing atmosphere at a temperature of about 200° C. or greater.

9. The method of claim 8 wherein said oxidizing temperature is from about 600° C. to about 900° C.

10. The method of claim 1 wherein a rapid thermal oxidation process is employed as the oxidizing step.

11. The method of claim 1 wherein said etching step includes a wet chemical etchant.

12. The method of claim 11 wherein said wet chemical etchant is HF.

13. The method of claim 1 further comprising forming a first electrode in said substrate, lining said smooth hemispherical grooved walls with a node dielectric material, and forming a second electrode on said node dielectric.

14. The method of claim 1 further comprising forming a first electrode on said smooth hemispherical grooved walls, forming a node dielectric material on said first electrode, and forming a second electrode on said node dielectric.

15. The method of claim 1 wherein all of said discontinuous polysilicon layer is consumed in said oxidizing step.

16. The method of claim 10 wherein all of said discontinuous polysilicon layer is consumed in said oxidizing step.

* * * * *